US006354311B1

(12) United States Patent
Kimura et al.

(10) Patent No.: US 6,354,311 B1
(45) Date of Patent: Mar. 12, 2002

(54) SUBSTRATE DRYING APPARATUS AND SUBSTRATE PROCESSING APPARATUS

(75) Inventors: Masahiro Kimura; Hiroyuki Araki, both of Shiga (JP)

(73) Assignee: Dainippon Screen Mfg. Co., Ltd. (JP)

( * ) Notice: Subject to any disclaimer, the term of this patent is extended or adjusted under 35 U.S.C. 154(b) by 0 days.

(21) Appl. No.: 09/522,205

(22) Filed: Mar. 9, 2000

Related U.S. Application Data

(63) Continuation-in-part of application No. 09/059,188, filed on Apr. 13, 1998, now abandoned.

(30) Foreign Application Priority Data

Oct. 9, 1997 (JP) .............................................. 9-245598
Oct. 9, 1997 (JP) .............................................. 9-245601

(51) Int. Cl.⁷ ................................................ B08B 7/04
(52) U.S. Cl. ........................ 134/61; 134/95.2; 134/902
(58) Field of Search ............................. 34/75–78, 469, 34/470; 134/902, 61, 95.2, 135

(56) References Cited

U.S. PATENT DOCUMENTS 5,156,173 A * 10/1992 Keyser et al. ................ 134/61
5,369,891 A * 12/1994 Kamikawa ...................... 34/78
5,520,744 A *  5/1996 Fujikawa et al. ........ 134/902 X
5,826,601 A * 10/1998 Muraoka et al. ....... 134/95.2 X
6,027,574 A *  2/2000 Fishkin et al. ......... 134/95.2 X
6,145,519 A * 11/2000 Konishi ...................... 134/95.2

* cited by examiner

Primary Examiner—Philip Coe
(74) Attorney, Agent, or Firm—Ostrolenk, Faber, Gerb & Soffen, LLP

(57) ABSTRACT

A deionized water temperature control part cools deionized water which is supplied from a deionized water supply source into a processing bath through a pipe after completely cleaning a substrate in the processing bath for maintaining the deionized water at a constant temperature which is lower than the ordinary temperature. A supply port of an IPA.N₂ supply part provided in a casing of a multi-functional processing part is directed upward, thereby supplying IPA vapor upward with carrier gas of N₂ for forming an atmosphere containing IPA vapor in high concentration above the processing bath. Thus, the substrate cooled to a low temperature is dried in the atmosphere containing the IPA vapor of the ordinary temperature in the upper portion of the processing bath when pulled up from the processing bath. Thus, the amount of the IPA vapor dissolved in the deionized water stored in the processing bath may be small, whereby consumption of the IPA vapor as well as generation of particles can be suppressed.

6 Claims, 6 Drawing Sheets

SUBSTRATE DRYING APPARATUS AND SUBSTRATE PROCESSING APPARATUS

This application is a Continuation-in-part application of application Ser. No. 09/059,188, filed Apr. 13, 1998, and now abandoned.

BACKGROUND OF THE INVENTION

1. Field of the Invention

The present invention relates to a substrate drying apparatus for dipping a substrate such as a semiconductor wafer, a glass substrate for a photomask or a liquid crystal display or a substrate for an optical disk (hereinafter simply referred to as a substrate) in a processing bath storing a processing liquid for processing the same and drying the substrate taken out from the processing bath by locating the same in an atmosphere containing vapor of a solvent, a substrate processing apparatus comprising the same and a substrate drying method.

2. Description of the Background Art

In a conventional substrate cleaning/drying apparatus for cleaning and drying a substrate, a processing bath is provided in a processing chamber for storing deionized water and dipping the substrate therein, so that the substrate is thereafter pulled up from the processing bath into an atmosphere containing IPA vapor (isopropyl alcohol vapor) while blowing the IPA vapor downward from a supply nozzle provided on an upper portion of the processing chamber with carrier gas of $N_2$ and the IPA is condensed with respect to the deionized water adhering to the substrate surface, thereby removing the deionized water and processing residues contained therein and drying the substrate.

In order to condense the IPA on the substrate surface, the IPA vapor is set at a temperature higher than that of the deionized water, which is at the ordinary temperature.

In the aforementioned conventional apparatus, however, the IPA vapor is supplied into the closed processing chamber while taking out the substrate from the processing bath. Thus, it is difficult to excellently remove the water and the processing residues from the overall surface of the substrate.

Although it is important to condense the IPA vapor on the overall surface of the substrate as evenly as possible in order to remove the water and the processing residues adhering to the substrate surface, the IPA vapor may form a current in the closed chamber when blown into the closed chamber while taking out the substrate in the aforementioned conventional apparatus. Thus, the condensed part of the IPA vapor may be biased on the substrate surface or the amount of the condensed IPA vapor may be irregular. If the IPA vapor is partially uncondensed or the amount of the condensed IPA vapor is small, the water and the processing residues partially remain on the substrate surface and dried as such to deteriorate the quality of the substrate or cause particles in a subsequent step.

Further, the IPA vapor supplied at a high temperature is readily dissolved in the deionized water stored in the processing bath, to disadvantageously increase IPA consumption.

Although the substrate is taken out from the processing bath after the same is sufficiently cleaned, particles may adhere to the substrate.

Further, the concentration of the IPA vapor in the atmosphere of the processing chamber must be increased to approach a saturated state, leading to requirement for a large amount of IPA.

SUMMARY OF THE INVENTION

An apparatus for drying a substrate according to a first aspect of the present invention comprises a processing bath for storing a processing liquid, a chamber for storing the processing bath, solvent supply means for supplying vapor of a solvent into the chamber, handling means for pulling up the substrate from the processing bath, liquid supply means for supplying a processing liquid into the processing bath, and temperature control means for maintaining the processing liquid at a predetermined temperature which is lower than the ordinary temperature.

The temperature of the atmosphere containing the vapor of the solvent may not be increased beyond necessity in consideration of temperature fluctuation of the processing liquid, whereby safety can be improved while maintaining drying performance. Further, the amount of the solvent dissolved in the processing liquid may be small, whereby consumption of the solvent can be suppressed and the drying efficiency can be improved. In addition, the dissolved solvent hardly comes into contact with the surface of the substrate dipped in the processing liquid, whereby generation of particles can be suppressed.

The substrate can be dried by supplying the vapor of the solvent at the ordinary temperature with no heating to a high temperature, whereby the safety can be further improved while maintaining the drying performance. Further, the amount of the solvent dissolved in the processing liquid stored in the processing bath may be further reduced, whereby generation of particles can be further suppressed.

According to a second aspect of the present invention, the processing liquid is a cleaning liquid.

A layer of the solvent vapor of required concentration can be formed around the liquid level of the processing liquid even if no gas containing the solvent vapor is supplied toward the liquid level of the processing liquid, the amount of the solvent vapor dissolved in the processing liquid is reduced and the amount of supply of the solvent vapor is small, whereby the drying efficiency can be improved and consumption of the solvent can be further suppressed. Further, no gas containing the solvent vapor is supplied toward the liquid level while the amount of the supplied solvent vapor is small, whereby the amount of the solvent dissolved in the processing liquid is reduced. Thus, generation of particles can be suppressed by dipping the substrate in the processing liquid containing a small amount of solvent dissolved therein.

A first object of the present invention is to provide a substrate drying apparatus having excellent drying efficiency.

A second object of the present invention is to provide a substrate drying apparatus suppressing consumption of a solvent and generation of particles.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<<1. Mechanical Structure and Apparatus Arrangement of This Embodiment>>

This embodiment of the present invention is now described with reference to the drawings.

Figure 1:
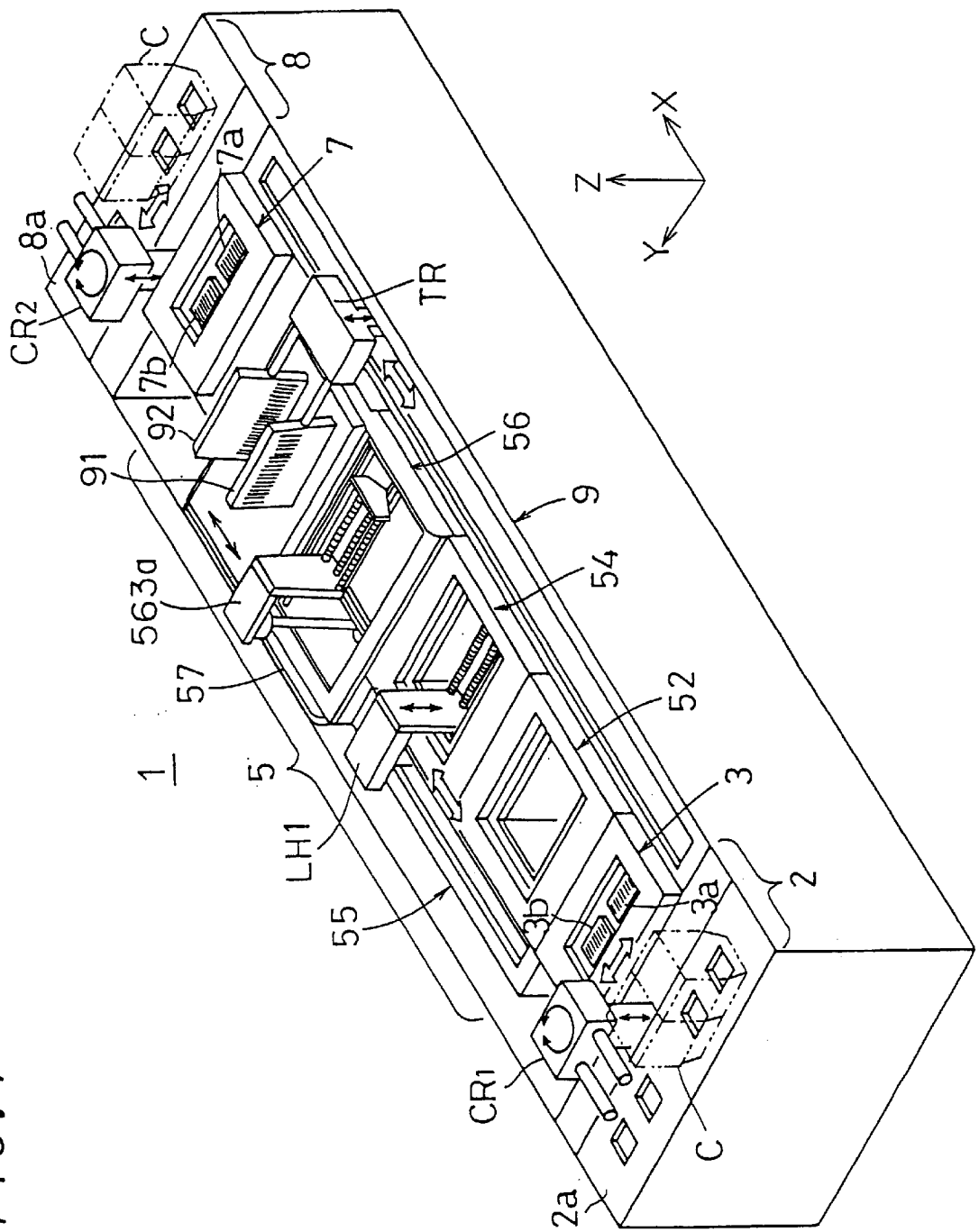
FIG. 1 is a perspective view showing the structure of a substrate processing apparatus according to this embodiment of the present invention.

FIG. 1 is a perspective view showing the structure of a substrate processing apparatus 1 according to this embodiment of the present invention. As shown in FIG. 1, the apparatus 1 comprises a cassette introduction part 2 for introducing cassettes C storing unprocessed substrates, a substrate takeout part 3 for receiving the cassettes C from the cassette introduction part 2 and simultaneously taking out the substrates from the cassettes C, a substrate processing part 5 for successively cleaning the unprocessed substrates taken out from the cassettes C, a substrate storage part 7 for simultaneously storing the processed substrates in the cassettes C after cleaning, and a cassette discharge part 8 for discharging the cassettes C storing the processed substrates. Further, a substrate transfer/transport mechanism 9 is arranged in front of the apparatus 1 over the substrate takeout part 3 and the substrate storage part 7, for transporting and transferring the substrates between the aforementioned parts before, during and after the cleaning.

The cassette introduction part 2 comprises a cassette transfer robot CR1 which is horizontally and vertically movable and rotatable about a vertical axis, for transferring a pair of cassettes C placed on predetermined positions of a cassette stage 2a to the substrate takeout part 3.

The substrate takeout part 3 comprises a pair of vertically movable holders 3a and 3b. The holders 3a and 3b are provided with guide grooves on upper surfaces thereof, to be capable of vertically supporting the unprocessed substrates stored in the cassettes C in parallel with each other. When moving upward, therefore, the holders 3a and 3b take out the substrates from the cassettes C. The holders 3a and 3b transfer the substrates taken out from the cassettes C to a transport robot TR provided on the substrate transfer/transport mechanism 9, for introducing the same into the substrate processing part 5 after horizontal movement.

The substrate treating part 5 is formed by a chemical solution processing part 52 comprising chemical solution bathes CB storing chemical solutions, a rinsing part 54 comprising a rinsing bath WB storing deionized water (the chemical solution processing part 52 and the rinsing part 54 corresponds to the "substrate processing part") and a multi-functional part 56, described later in detail, comprising a processing bath 562 for processing the substrates with various types of chemical solutions and rinsing the same in a single bath.

In the substrate processing part 5, a first substrate dipping mechanism 55 is arranged at the back of the chemical solution processing part 52 and the rinsing part 54 for dipping the substrates received from the transport robot TR in the chemical solution bathes CB of the chemical solution processing part 52 and the rinsing bath WB of the rinsing part 54 by a vertically and transversely movable lifter head LH1 provided thereon. A second substrate dipping mechanism 57 is arranged at the back of the multi-functional processing part 56, for supporting the substrates received from the transport robot TR in the processing liquid 562 of the multi-functional processing part 56 by a vertically movable lifter head 563a provided thereon.

The substrate storage part 7, which is similar in structure to the substrate takeout part 3, receives the processed substrates grasped by the transport robot TR by a pair of vertically movable holders 7a and 7b and stores the same in the cassettes C.

The cassette discharge part 8, which is similar in structure to the cassette introduction part 2, comprises a movable cassette transfer robot CR2, for transferring the pair of cassettes C placed on the substrate storage part 7 on prescribed positions of a cassette stage 8a.

The substrate transfer/transport mechanism 9 comprises the transport robot TR which is vertically and horizontally movable. The substrate transfer/transport mechanism 9 grasps the substrates by a pair of rotatable hands 91 and 92 provided on the transport robot TR, thereby transferring the substrates supported by the holders 3a and 3b of the substrate takeout part 3 to the lifter head LH1 provided on the first substrate dipping mechanism 55 of the substrate processing part 5, and transfers the same from the lifter head LH1 to the lifter head 563a provided on the adjacent second substrate dipping mechanism 57 and from the lifter head 563a to the holders 7a and 7b of the substrate storage part 7.

Figure 2:
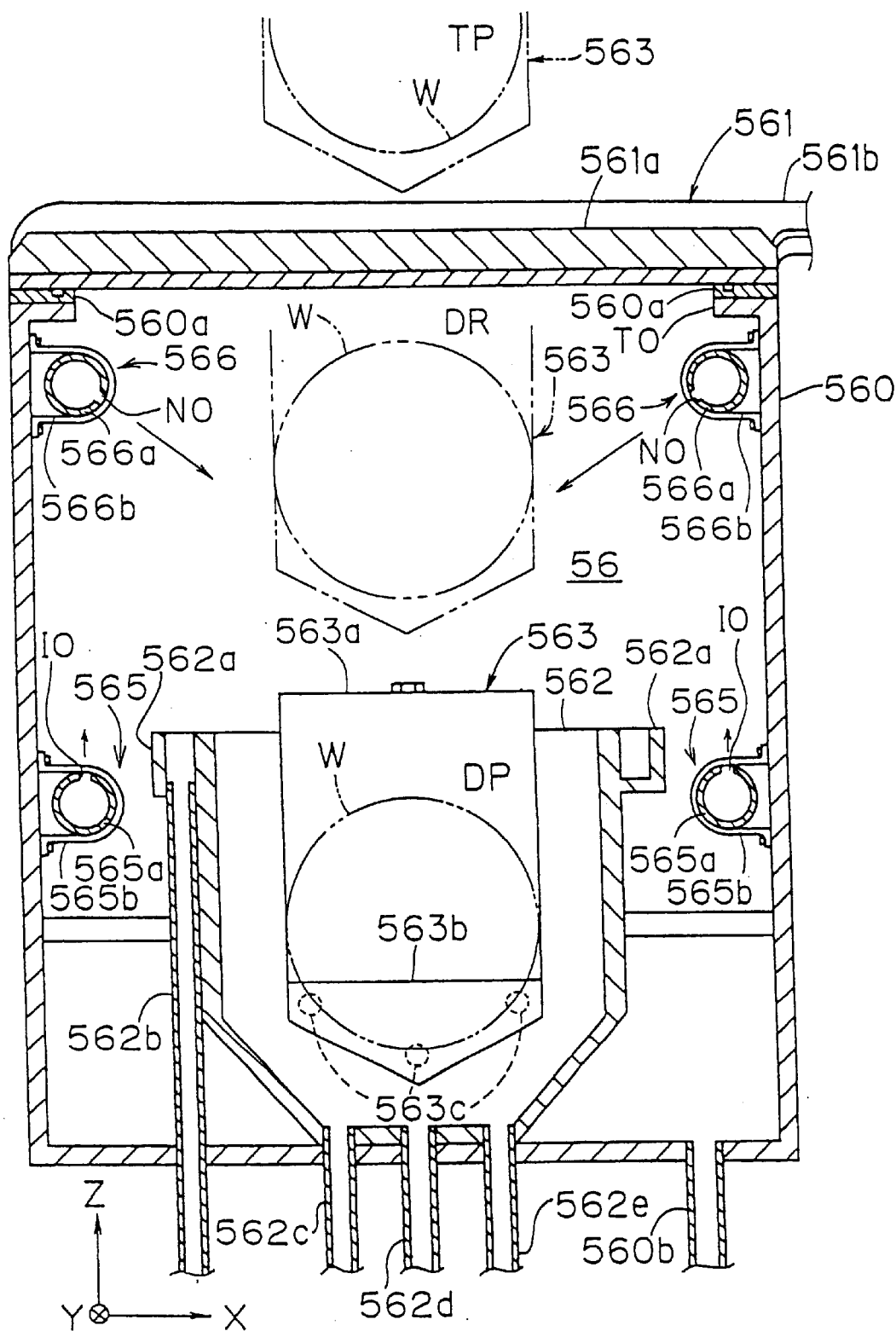
FIG. 2 is a longitudinal sectional view showing a multi-functional processing part according to this embodiment.
Figure 3:
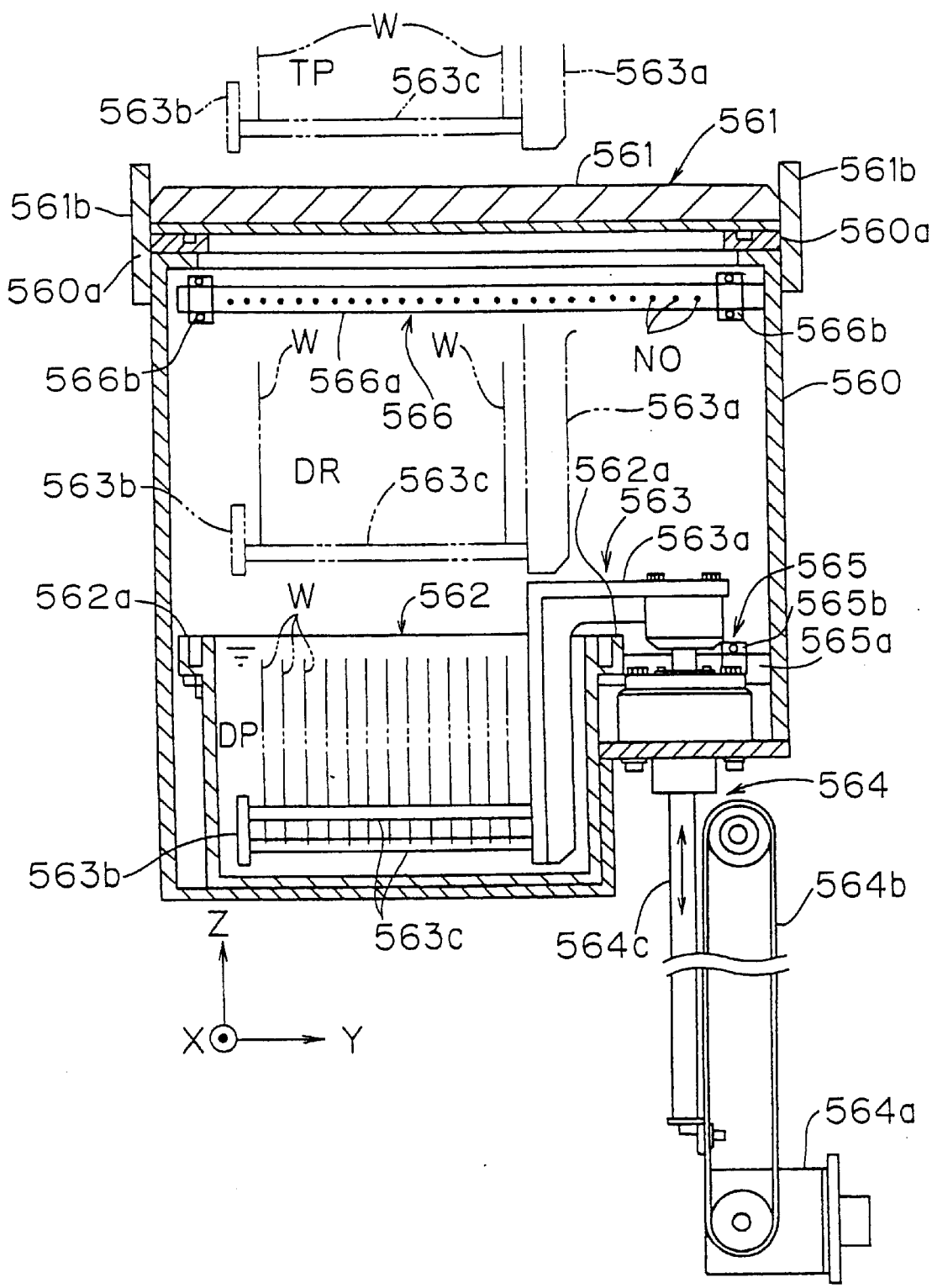
FIG. 3 is another longitudinal sectional view showing the multi-functional processing part according to this embodiment.

With reference to longitudinal sectional views shown in FIGS. 2 and 3, the mechanical structure and a schematic operation of the multi-functional processing part 56 are described.

The multi-functional processing part 56 mainly comprises a casing 560, a shutter 561, the processing bath 562, a lifter 563, a lifter driving part 564, $IPA.N_2$ supply parts 565 and $N_2$ supply parts 566. The $IPA.N_2$ supply parts 565 correspond to "supply means."

The casing 560 comprises a substrate introduction/discharge part TO in its upper surface so that a seal member 560a is fixed to its periphery, and further comprises an exhaust pipe 560b on its bottom surface.

The shutter 561 comprises a shielding plate 561a and a guide 561b which is provided on an upper end of a side surface of the casing 560 to hold the same, so that the shielding plate 561a slightly vertically moves and horizontally slides along a guide rail of the guide 561b to open/close the shutter 561. The seal member 560a provided on the upper surface of the casing 560 maintains the shutter 561 airtight in a closed state.

The processing bath 562 can be filled up with hydrofluoric acid (HF) and deionized water DIW, which is a cleaning liquid (hereinafter the hydrofluoric acid and the deionized water are referred to as "processing liquid") so that the substrates W are dipped therein to be etched and cleaned. Further, pipes 562c, 562d and 562e for feeding back, discharging and supplying the processing liquid respectively are coupled to the bottom surface of the processing bath 562. In addition, processing liquid collecting grooves 562a are provided on upper ends of four outer side surfaces of the processing bath 562, and a processing liquid collecting pipe 562b is coupled thereto.

The lifter 563 comprises three substrate guides 563c having a number of holding grooves for freely engaging with and holding the substrates W between the lifter head 563a and a holding plate 563b.

The lifter driving part 564 comprises a timing belt 564b mounted on a servo motor 564a and a vertically extending shaft 564c coupled to the timing belt 564b. An upper end of the shaft 564c is coupled to the lifter head 563a of the lifter 563, to be capable of vertically moving the lifter 563 and the plurality of substrates W held thereon by the servo motor 564a and locating the same on a transfer position TP for transferring the substrates W to the transport robot TR, a drying position DR for drying the substrates W, and a dipping position DP for dipping the substrates W in the processing liquid shown in FIGS. 2 and 3.

In the IPA.N$_2$ supply parts 565, a pair of IPA.N$_2$ supply pipes 565a are mounted on inner side surfaces of the casing 560 in positions lower than the liquid level of the processing liquid stored in the processing bath 562 by brackets 565b respectively, and the IPA.N$_2$ supply pipes 565a are provided with a plurality of upwardly opening supply ports IO for supplying IPA serving as a solvent with N$_2$ gas. Although not shown in FIGS. 2 and 3, a pipe 565c (see FIG. 4) is coupled to the IPA.N$_2$ supply pipes 565a.

Also in the N$_2$ supply parts 566, a pair of N$_2$ supply pipes 566a are mounted on the inner side surfaces of the casing 560 by brackets 566b respectively, and the N$_2$ supply pipes 566a are provided with a plurality of supply ports NO (symbol NO denotes only parts of the supply ports in FIG. 3) for supplying N$_2$. Although not shown in FIGS. 2 and 3, a pipe 566c (see FIG. 4) is coupled to the N$_2$ supply pipes 566a.

Figure 4:
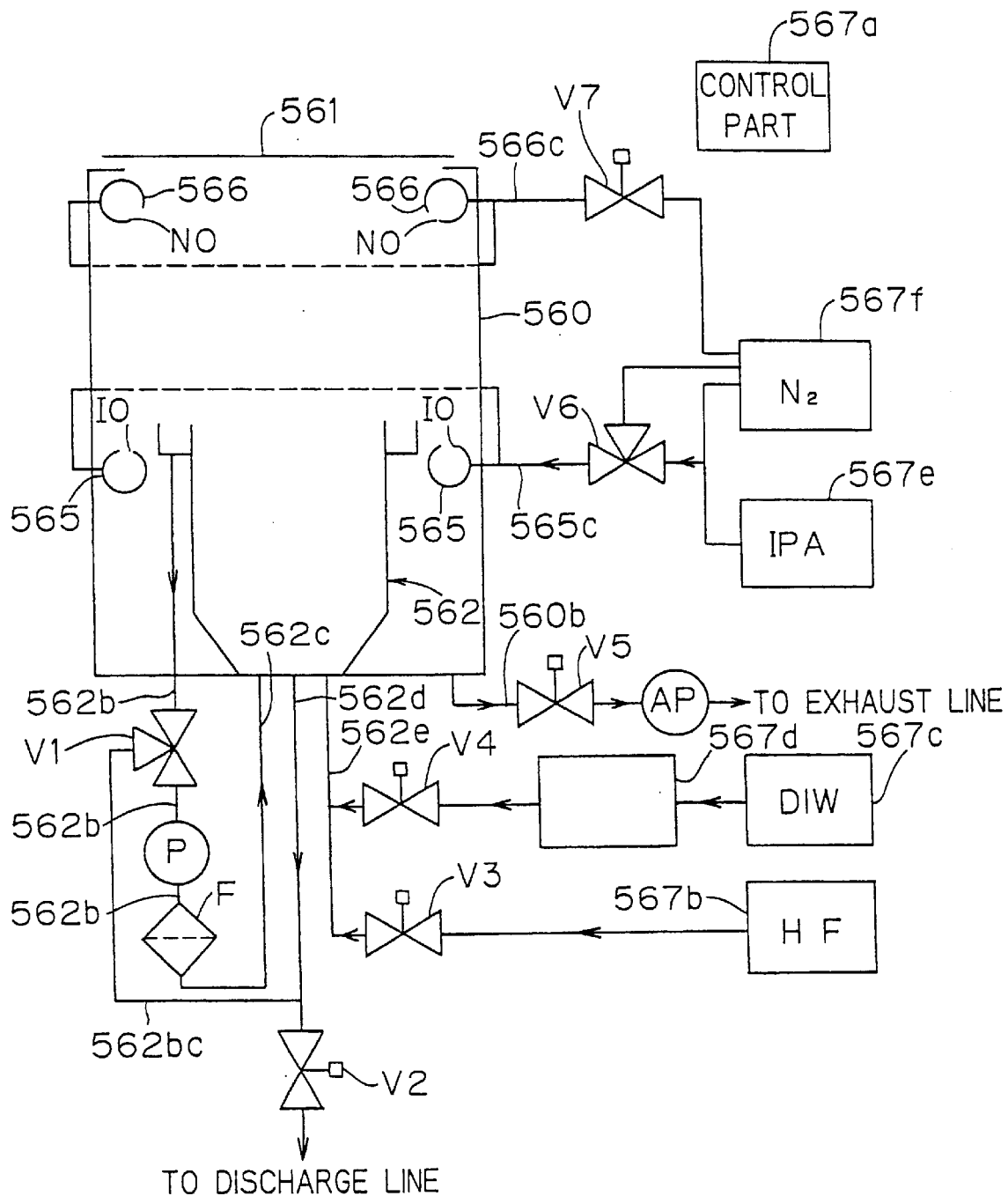
FIG. 4 is a model diagram showing the structure of the multi-functional processing part according to this embodiment.

FIG. 4 is a model diagram showing the structure of the multi-functional processing part 56. In addition to the aforementioned mechanical structure, the multi-functional processing part 56 comprises a control part 567a, which is electrically connected with three-way valves V1 and V6 and valves V2 to V5 and V7 described later respectively, for switching passages of the three-way valves V1 and V6 and opening/closing the three-way valve V6 and the valves V2 to V5 and V7.

The three-way valve V1, a pump P and a filter F are inserted in the pipe 562b, and the pipe 562c is coupled to the filter F. A port of the three-way valve V1 not coupled to the pipe 562b is coupled to the pipe 562d for allowing communication between the processing bath 562 and a discharge line in the equipment through a pipe 562bc, and the valve V2 is inserted in the forward portion of the pipe 562d. The control part 567a switches an operation of feeding back the processing liquid overflowing from the processing bath 562 into the processing liquid collecting grooves 562a after filtering by the filter F and an operation of discharging the processing liquid to the discharge line at prescribed timing.

The pipe 562e branches into two parts, so that the first part is coupled to an HF supply source 567b through the valve V3 and the second part is coupled with a deionized water supply source 567c through the valve V4 and a deionized water temperature control part 567d. The control part 567a supplies either HF or the deionized water DIW to the processing bath 562 at predetermined timing by controlling the valves V3 and V4.

The pipe 560b communicates with an exhaust line in the equipment through the valve V5 and an air pump AP, and the control part 567a discharges the atmosphere in the casing 560 at prescribed timing by controlling the valve V5.

The pipe 565c is coupled to an N$_2$ supply source 567f and an IPA supply source 567e through the three-way valve V6, and the control part 567a supplies IPA vapor with N$_2$ gas as a carrier gas or only N$_2$ gas into the casing 560 through the IPA.N$_2$ supply pipes 565a by controlling the three-way valve V6 or closes the three-way valve V6 at prescribed timing.

The pipe 566c is coupled to the N$_2$ supply source 567f through the valve V7, and the control part 567a supplies N$_2$ gas into the casing 560 through the N$_2$ supply pipes 566a at predetermined timing by controlling the valve V7.

The principal part of the multi-functional processing part 56 is now described.

In this multi-functional processing part 56, the deionized water temperature control part 567d comprises cooling means which is formed by a temperature sensor for measuring the temperature of the deionized water DIW supplied from the deionized water supply source 567c as described above and a heat pump for cooling the deionized water DIW, and the control part 567a performs control for driving the cooling means when the measured temperature exceeds a predetermined level and stopping the cooling means when the former is reduced below the latter on the basis of the result of the temperature measurement by the temperature sensor, to be capable of maintaining the deionized water DIW at a predetermined temperature. The control part 567a can switch the temperature control of the deionized water DIW in response to processing steps, as described later.

No heating means is provided on the pipe 565c connecting the IPA supply source 567e with the IPA.N$_2$ supply parts 565 of the multi-functional processing part 56. According to this embodiment of the present invention, therefore, the IPA vapor supplied from the IPA.N$_2$ supply parts 565 to the casing 560 is substantially at the ordinary temperature (substantially equal to the room temperature: about 20° C.), while the deionized water temperature control part 567d constantly maintains the deionized water DIW at a predetermined temperature which is lower than the ordinary temperature by about 10° C., i.e., at about 10° C. The temperature sensor and the cooling means can be prepared from well-known ones.

In the processing step for performing the aforementioned temperature control, it is also possible to maintain the temperature of the substrates W at about 10° C., which is lower than the ordinary temperature of the IPA vapor by about 10° C., by supplying the temperature-controlled deionized water DIW into the processing bath 562 and dipping the substrates W therein. In this embodiment, therefore, IPA is condensed with respect to the deionized water DIW adhering to the surfaces of the substrates W with no heating of the IPA vapor, whereby the deionized water DIW can be quickly removed from the substrates W pulled up from the processing bath 562.

The IPA.N$_2$ supply parts 565 of the multi-functional processing part 56 are provided on a side of the processing bath 562 in positions lower than the upper end of the processing bath 562, (i.e. lower than the liquid level of the processing liquid stored in the processing bath 562) while the supply ports IO thereof are directed upward. Thus, the IPA.N$_2$ supply parts 565 blow and supply the IPA vapor upward before the substrates W are substantially completely pulled up from the processing bath 562.

While a conventional apparatus supplying high-temperature IPA vapor toward deionized water which is stored in a processing bath and maintained at the outside air temperature from above requires about 300 cc of IPA for drying 50 substrates of 200 mm in diameter, the inventive apparatus can reduce the amount of such IPA to not more than 30 cc, due to the aforementioned supply of IPA vapor. Further, the inventive apparatus can also reduce the amount of generated particles compared with the conventional apparatus, as a particularly important effect.

It is inferred that the inventive apparatus can reduce IPA consumption since the IPA vapor supplied from the IPA.N$_2$ supply ports IO neither directly strikes nor undulates the surface of the deionized water DIW which is stored in the processing bath and hence the amount of IPA dissolved in the deionized water DIW stored in the processing bath 562 is reduced. It is also inferred that the IPA dissolved in the deionized water DIW which is stored in the processing bath 562 hardly comes into contact with the surfaces of the cleaned substrates W due to the small amount of dissolution, to reduce generation of particles. It is further inferred that the degree of dissolution in the deionized water DIW is further reduced since the IPA vapor is set not at a high temperature but at the ordinary temperature, thereby increasing the drying speed and suppressing IPA consumption as well as generation of particles.

Figure 5:
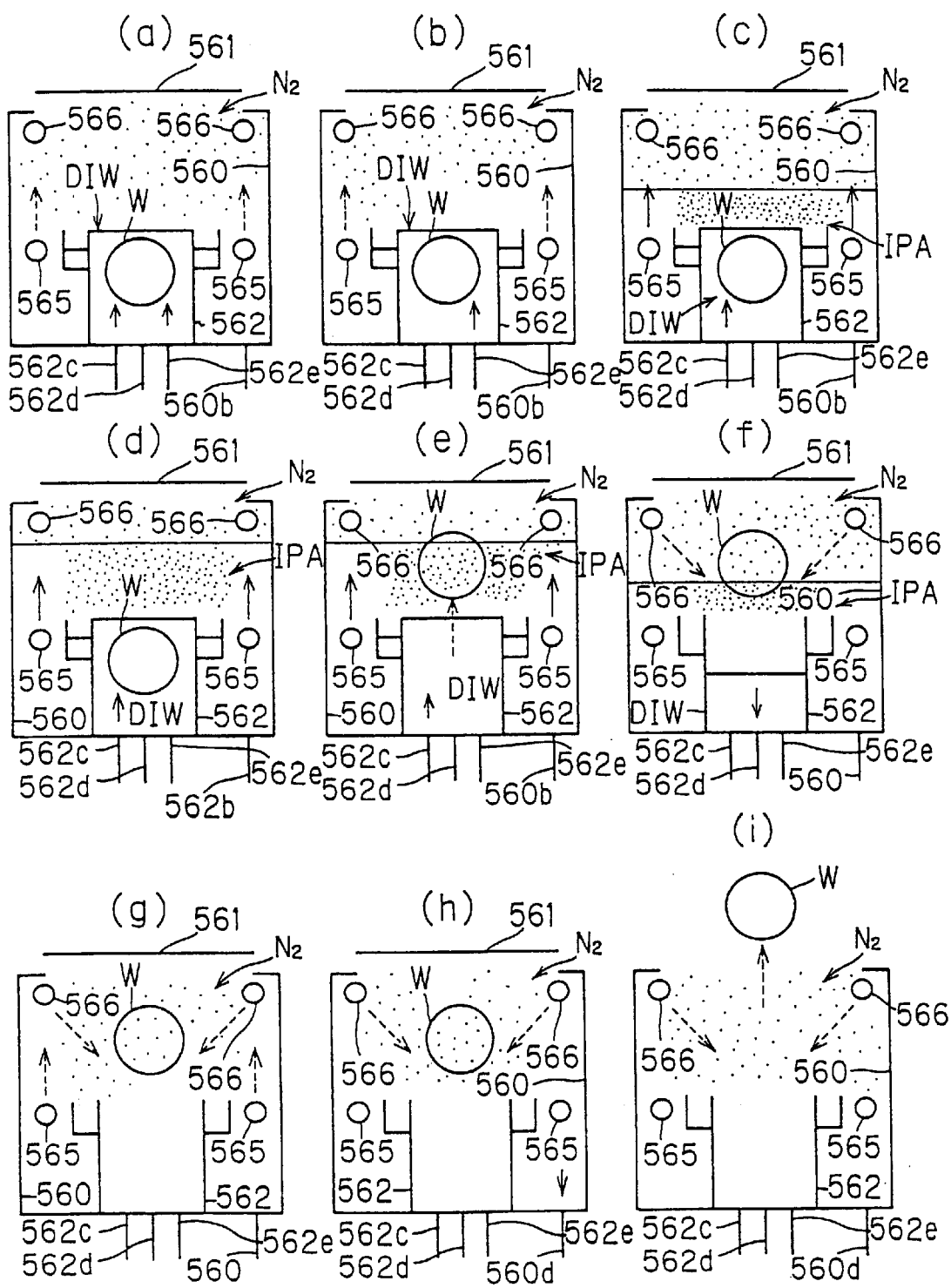
FIG. 5 is a model diagram showing the procedure of substrate drying in this embodiment.

Influence by the following reason is also inferred. FIG. 5 is a model diagram showing the procedure of substrate drying. The following description is made with reference to (c) in FIG. 5.

In the conventional apparatus, it is difficult to separate $N_2$ gas from IPA vapor since the IPA sprayed from above the processing bath stirs the atmosphere in the vicinity of the surface of the deionized water stored in the processing bath. In the present invention, on the other hand, it is inferred that the speed of the IPA vapor upwardly supplied with $N_2$ serving as carrier gas is so reduced by gravity and resistance by the atmosphere that the upward movement then stops, $N_2$ and IPA gradually separate from each other due to the difference between the molecular weights of $N_2$ molecules and IPA molecules, and a layer which is rich in $N_2$ having the smaller molecular weight is formed on an upper portion while a layer which is rich in IPA vapor is formed on a lower portion close to the water surface, as shown at (c) in FIG. 5. It is also inferred that the substrates W pulled up from the deionized water DIW stored in the processing bath 562 after such formation of the $N_2$ layer and the IPA layer pass through the layer which is rich in IPA vapor immediately after the same are pulled up, and hence IPA is readily dissolved in the deionized water DIP adhering to the substrates W, whereby the deionized water DIW readily separates from the substrates W, leading to smaller IPA consumption. It is further inferred that the internal energy of the atmosphere is low to suppress diffusion since the IPA vapor is set not at a high temperature but at the ordinary temperature, whereby the atmosphere in the casing 560 further readily separates into the IPA layer and the $N_2$ layer to further reduce the IPA consumption.

While about 50 cc of IPA is required for drying 50 substrates W of 200 mm in diameter by upwardly supplying high-temperature IPA vapor into the processing bath 562 without cooling the deionized water DIW in the multi-functional processing part 56, the amount of required IPA is reduced to not more than about 30 cc when IPA vapor is upwardly supplied from the IPA.$N_2$ supply parts 565 at the ordinary temperature while cooling the deionized water DIW as described above. Further, generation of particles is also reduced.

The reason therefor is inferred as follows:

It is inferred that the internal energy of the atmosphere is low to suppress diffusion since the IPA vapor is set not at a high temperature but at the ordinary temperature, whereby the atmosphere in the casing 560 further readily separates into the IPA layer and the $N_2$ layer to further reduce the IPA consumption.

It is also inferred that the IPA layer formed on the lower portion is at the ordinary temperature in the IPA layer and the $N_2$ layer formed by separation of the atmosphere in the casing 560 and hence the IPA vapor is hardly dissolved in the deionized water DIW stored in the processing bath 562, the IPA vapor consumption is further reduce, and particles are hardly generated by IPA dissolved in the deionized water DIW stored in the processing bath 562 to reach the surfaces of the substrates W.

In the multi-functional processing part 56 according to this embodiment, further, the supply ports NO of the $N_2$ supply pipes 566a provided on the upper portions of the casing 560 are obliquely directed downward, as shown in FIG. 2. More correctly, the supply ports NO are directed toward the surfaces of the substrates W located on the drying position DR and a portion around the substrate guide 563c of the lifter 563. After completion of cleaning with the deionized water DIW in the processing bath 562, therefore, the lifter 563 is located on the drying position DR while holding the substrates W and $N_2$ gas is sprayed toward the surfaces of the substrates W and the portion around the substrate guide 563c of the lifter 563 by spraying $N_2$ from the $N_2$ supply parts 566 for blowing off the deionized water DIW remaining between the substrates W and the holding grooves and quickly drying the substrates W. The substrates W are not returned into the deionized water DIW stored in the processing bath 562 after pulled up from the same, and hence no problem is caused by undulating the surface of the deionized water DIW stored in the processing bath 562 for facilitating dissolution of IPA in the deionized water DIW.

<<2. Procedure and Effect of This Embodiment>>

Figure 6:
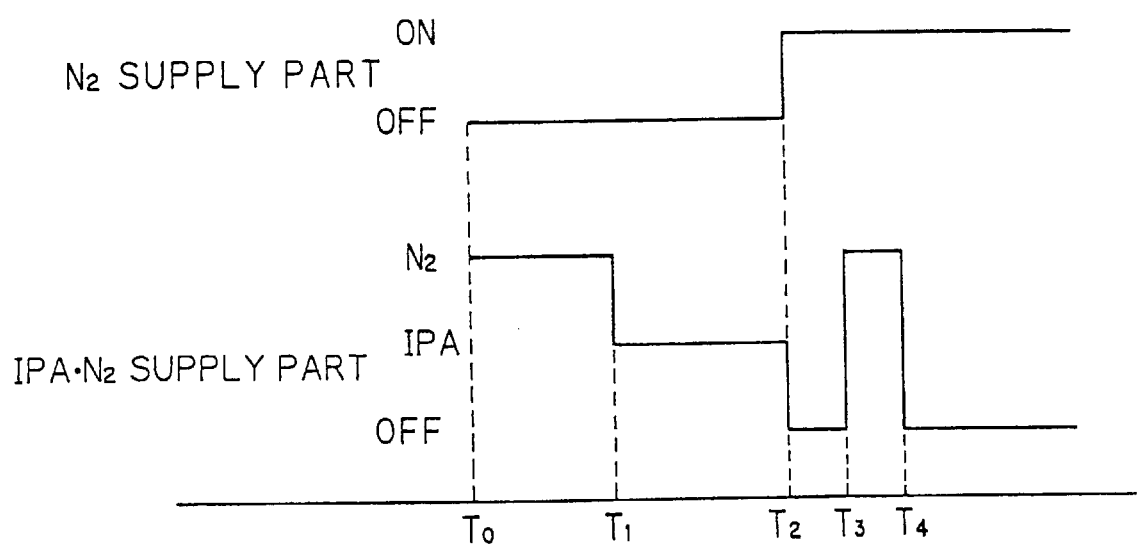
FIG. 6 is a timing chart illustrating gas supply in $N_2$ supply parts and $IPA.N_2$ supply parts.

With reference to FIG. 5 showing the procedure of substrate drying by the multi-functional processing part 56 according to this embodiment and FIG. 6 showing a timing chart of $N_2$ or IPA vapor supply from the IPA.$N_2$ supply parts 565, the procedure is now described. It is assumed that etching with HF or the like is completed before the following procedure (the valve V3 is closed). The control part 567a performs the following control.

First, the control part 567a introduces the substrates W into the processing bath 562, which is previously filled up with the deionized water DIW at the ordinary temperature, for cleaning the same ((a) in FIG. 5). At this time, the IPA.$N_2$ supply parts 565 supply $N_2$ gas while the deionized water DIW overflows from the processing bath 562, the three-way valve V1 is connected to the pipe 562b, the valves V2, V4 and V5 are closed, the overflowing deionized water DIW is returned into the processing bath 562 through the pipe 562c, the valve V7 is closed, the $N_2$ supply parts 566 supply no $N_2$ gas and the three-way valve V6 connects the passage from the $N_2$ supply source 567f to the pipe 565c (time T0 in FIG. 6).

Then, the control part 567a supplies the deionized water DIW which overflows from the processing bath 562 and is cooled by the deionized water temperature control part 567d through the pipe 562e, thereby replacing HF or the deionized water DIW of the ordinary temperature stored in the processing bath 562 with the cooled one ((b) in FIG. 5, times T0 to T1 in FIG. 6). Namely, the control part 567a supplies low-temperature deionized water DIW to a lower portion of the ordinary-temperature deionized water DIW, so that no replacement by convection takes place therebetween due to the relation between the temperatures, the ordinary-temperature deionized water DIW successively overflows from the upper end of the processing bath 562 and the processing bath 562 is finally filled up with the low-temperature deionized water DIW, for attaining efficient replacement. In this stage, the open/closed states of the valves V3 and V5 to V7 and the gas supply situations of the IPA.N$_2$ supply parts 565 and the N$_2$ supply parts 566 are similar to those at the time T0, except that the three-way valve V1 is connected to the pipe 562bc and the valves V2 and V4 are open.

Then, the control part 567a connects the passage connecting the three-way valve V6 to both of the IPA supply source 567e and the N$_2$ supply source 567f to the pipe 565c, so that the IPA.N$_2$ supply parts 565 start supplying the IPA vapor with N$_2$ serving as carrier gas ((c) in FIG. 5, the time T1 in FIG. 6). At this time, the three-way valve V1 is connected to the pipe 562b, the valves V2, V4 and V5 are closed, the overflowing deionized water DIW is returned into the processing bath 562 through the pipe 562c, the valve V7 is closed, and the N$_2$ supply parts 566 supply no N$_2$ gas.

It is inferred that the N$_2$ layer and the IPA paper layer are formed on the upper portion and the lower portion (i.e., immediately above the processing bath 562) in the casing 560 by continuously supplying the IPA paper for some time ((d) in FIG. 5, times T1 to T2 in FIG. 6). In this stage, the open/closed states of the three-way valves V1 and V6 and the valves V2 to V5 and V7 and the gas supply situations of the IPA.N$_2$ supply parts 565 and the N$_2$ supply parts 566 are similar to those at the time T1.

Then, the control part 567a moves up the lifter 563 for pulling up the substrates W from the cooled deionized water DIW stored in the processing bath 562 and passing the same through the IPA vapor layer for removing most part of the deionized water DIW adhering to the substrates W ((e) in FIG. 5, times T1 to T2 in FIG. 6). Also in this stage, the open/closed states of the three-way valves V1 and V6 and the valves V2 to V5 and V7 and the gas supply situations of the IPA.N$_2$ supply parts 565 and the N$_2$ supply parts 566 are similar to those at the time T1.

Then, the control part 567a closes the three-way valve V6 for stopping supply of the IPA vapor from the IPA.N$_2$ supply parts 565 and opens the valve V7 for supplying N$_2$ from the N$_2$ supply parts 566 toward the portion around the substrate guide 563c of the lifter 563 located on the drying position DR, thereby blowing out the deionized water DIW remaining in the holding grooves and on the surfaces of the substrates W. The control part 567a further opens the valve V2, for discharging the deionized water DIW from the processing bath 562 to the discharge line ((f) in FIG. 5, time T2 in FIG. 6). In this stage, the open/closed states of the remaining valves V3 to V5 and the three-way valve V1 are similar to those at the time T1.

Then, the control part 567a connects the passage connecting the three-way valve V6 only to the N$_2$ supply source 567f with the pipe 565c, supplies only N$_2$ from the IPA.N$_2$ supply parts 565 and substantially completely fills up the casing 560 with an N$_2$ atmosphere ((g) in FIG. 5, time T3 in FIG. 6). In this stage, the open/closed states of the three-way valve V1 and the valves V2 to V5 and V7 and the gas supply situation of the N$_2$ supply parts 566 are similar to those at the time T2.

Then, the control part 567a opens the valve V5, discharges the atmosphere from the casing 560 through the pipe 560b and decompresses the casing 560 thereby completely drying the substrates W ((h) in FIG. 5, time T4 in FIG. 6). In this stage, the gas supply situation of the N$_2$ supply parts 566 is similar to that at the time T3, the control part 567a closes the three-way valve V6 for stopping gas supply from the IPA.N$_2$ supply parts 565, and the open/closed states of the three-way valve V1 and the remaining valves V2 to V4 and V7 are similar to those at the time T3.

Finally, the control part 567a opens the shutter 561 to the atmosphere of the outside of the closed chamber 112 and moves up the lifter 563 to the transfer position TP for taking out the substrates W from the casing 560, thereby completing the series of substrate drying ((i) in FIG. 5, after a time T4 in FIG. 6). In this stage, the open/closed states of the three-way valves V1 and V6 and the remaining valves V2 to V5 and V7 and the gas supply situations of the IPA.N$_2$ supply parts 565 and the N$_2$ supply parts 566 are similar to those at the time T4.

According to this embodiment of the present invention, as hereinabove described, the multi-functional processing part 56 maintains the deionized water DIW substantially at a constant temperature, whereby the temperature of the IPA vapor may not be increased beyond necessity in consideration of temperature fluctuation of the deionized water DIW. Further, the multi-functional processing part 56 cools the deionized water DIW for maintaining the same at the predetermined temperature, whereby the substrates W can be dried with the IPA vapor supplied at the ordinary temperature with no heating to a high temperature. Thus, safety is improved while maintaining drying performance and the amount of IPA vapor dissolved in the deionized water DIW stored in the processing bath 562 can be reduced since the same is not at a high temperature, whereby the substrate drying efficiency can be improved while suppressing IPA vapor consumption. Further, the dissolved IPA hardly comes into contact with the surfaces of the substrates W dipped in the deionized Water DIW, whereby generation of particles can be suppressed.

In addition, the supply ports IO of the IPA.N$_2$ supply parts 565 of the multi-functional processing part 56 are directed upward, whereby the amount of IPA vapor required at the time of pulling up the substrates W from the processing bath 562 can be suppressed, the drying time can be reduced by improving the drying efficiency, and generation of particles can be suppressed.

The N$_2$ supply parts 566 and the IPA.N$_2$ supply parts 565 supplying N$_2$ and IPA vapor can be switched in response to the stages of processing the substrates W, whereby IPA vapor and N$_2$ can be supplied to effective positions, the substrates W can be efficiently dried, and consumption of the IPA vapor and N$_2$ can be suppressed.

Further, the N$_2$ supply parts 566 provided on the upper portions supply no N$_2$ gas downward before the substrates W are substantially completely pulled up from the processing bath 562, whereby generation of particles as well as the IPA consumption can be suppressed.

After pulling up the substrates W, the deionized water DIW remaining on the surfaces of the substrates W and between the holding grooves and the substrates W can be blown off by spraying N$_2$ toward the substrates W and the portion around the substrate guide 563c from above, for quickly drying the substrates W.

<<3. Modification of This Embodiment>>

While the multi-functional processing part 56 according to this embodiment employs IPA and N$_2$ as the solvent and inert gas respectively, the present invention is not restricted to these but the solvent and the inert gas may alternatively be prepared from ethanol or methanol and helium gas or argon gas respectively.

While the multi-functional processing part 56 according to this embodiment comprises the N$_2$ supply parts 566, such N$_2$ supply parts 566 may be omitted so that only the IPA.N$_2$ supply parts 565 supply the IPA vapor and N$_2$.

While the IPA.N$_2$ supply parts 565 are arranged on the positions lower than the liquid level of the processing liquid stored in the processing bath 562 for receiving the substrates W in the multi-functional processing part 56 according to this embodiment, the same may alternatively be arranged above the liquid level.

While the multi-functional processing part 56 according to this embodiment supplies the IPA vapor at the ordinary temperature, the present invention is not restricted to this but the IPA vapor may be slightly heated to another temperature level so far as this temperature is higher than that of the deionized water DIW before the operation of pulling up the substrates W. In case of slightly heating the IPA vapor, the deionized water DIW may be maintained at a constant temperature close to the ordinary temperature with no cooling.

While the multi-functional processing part 56 according to this embodiment supplies the deionized water DIW while cooling and temperature-controlling the same for cooling and temperature-controlling the substrates W, the same may alternatively supply high-temperature IPA vapor without cooling and temperature-controlling the deionized water DIW.

While the multi-functional processing part 56 according to this embodiment employs the heat pump as cooling means in the deionized water temperature control part 567d, the present invention is not restricted to this but may employ another cooling means such as a Peltier element or the like.

While the multi-functional processing part 56 according to this embodiment comprises the deionized water temperature control part 567d, the same may alternatively cool the deionized water DIW with cooling means provided in the exterior of the substrate processing apparatus for supplying the same.

While the IPA.$N_2$ supply parts 565 having the upwardly directed supply ports IO are provided on the side of the processing bath 562 in the positions lower than the upper end thereby supplying the IPA vapor upward in the multi-functional processing part 56 according to this embodiment, the present invention is not restricted to this but the IPA.$N_2$ supply parts 565 may alternatively be provided above the upper end of the processing bath 562, or the supply ports IO may be directed obliquely upward or sideward.

While the invention has been shown and described in detail, the following description is in all aspects illustrative and restrictive. It is therefore understood that numerous modifications and variations can be devised without departing from the scope of the invention.

We claim:

1. An apparatus for drying a substrate, comprising:
   a) a processing bath for storing a processing liquid;
   b) a chamber for storing said processing bath;
   c) solvent supply means for supplying vapor of a solvent into said chamber;
   d) handling means for pulling up said substrate from said processing bath;
   e) liquid supply means for supplying a processing liquid into said processing bath; and
   f) temperature control means for maintaining said processing liquid at a predetermined temperature which is lower than the ordinary temperature.

2. The apparatus in accordance with claim 1, wherein said processing liquid is a cleaning liquid.

3. An apparatus for drying a substrate, comprising:
   a) a processing bath for storing a processing liquid;
   b) a chamber for storing said processing bath;
   c) supply means for supplying mixed gas of vapor of a solvent and inert gas into said chamber upward or obliquely upward; and
   d) handling means for pulling up said substrate from said processing bath.

4. The apparatus in accordance with claim 3, wherein said supply means comprises:
   c-1) a supply port opening provided outside said processing bath for supply said mixed gas of vapor of said solvent and inert gas upwardly at a level lower than an upper end of said processing bath.

5. An apparatus for processing a substrate, comprising:
   a) a substrate processing part for processing a substrate with a first processing liquid; and
   b) a substrate drying part for drying said substrate, said substrate drying part comprising:
   b-1) a processing bath for storing a second processing liquid;
   b-2) a chamber for storing said processing bath;
   b-3) solvent supply means for supplying vapor of a solvent into said chamber;
   b-4) handling means for pulling up said substrate from said processing bath;
   b-5) liquid supply means for supplying said second processing liquid into said processing bath; and
   b-6) temperature control means for maintaining said processing liquid at a predetermined temperature which is lower than the ordinary temperature.

6. An apparatus for processing a substrate, comprising:
   a) a substrate processing part for processing a substrate with a first processing liquid; and
   b) a substrate drying part for drying said substrate, said substrate drying part comprising:
   b-1) a processing bath for storing a second processing liquid;
   b-2) a chamber for storing said processing bath;
   b-3) supply means for supplying mixed gas of vapor of a solvent and inert gas into said chamber upward or obliquely upward; and
   b-4) handling means for pulling up said substrate from said processing bath.

* * * * *